(12) United States Patent
Chang

(10) Patent No.: US 11,921,952 B1
(45) Date of Patent: Mar. 5, 2024

(54) SIGNAL PROCESSING CIRCUIT AND METHOD

(71) Applicant: NOVATEK Microelectronics Corp., Hsin-Chu (TW)

(72) Inventor: Tsen-Wei Chang, Taichung (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 17/902,915

(22) Filed: Sep. 5, 2022

(51) Int. Cl.
*G06F 3/041* (2006.01)
*H03G 3/30* (2006.01)
*G06F 3/044* (2006.01)

(52) U.S. Cl.
CPC ........ *G06F 3/04184* (2019.05); *G06F 3/0412* (2013.01); *G06F 3/04164* (2019.05); *G06F 3/044* (2013.01); *H03G 3/30* (2013.01)

(58) Field of Classification Search
CPC ............. G06F 3/04184; G06F 3/04164; G06F 3/0412; G06F 3/044; H03G 3/30
See application file for complete search history.

(56) References Cited

U.S. PATENT DOCUMENTS

| 2007/0109274 A1* | 5/2007 | Reynolds | ................ G06F 3/041 345/173 |
| 2017/0147141 A1* | 5/2017 | Khazeni | ............ G06F 3/041662 |
| 2023/0094533 A1* | 3/2023 | Krah | ....................... G06F 3/042 345/174 |

* cited by examiner

*Primary Examiner* — Peter D McLoone
(74) *Attorney, Agent, or Firm* — Winston Hsu

(57) ABSTRACT

A signal processing circuit includes a driving signal generator and an encoder. The driving signal generator is configured to generate a driving signal. The encoder includes a multiplexer, a plurality of driver/receiver circuits and a summation circuit. The multiplexer is configured to receive multiple sensing signals in response to the driving signal. Among the driver/receiver circuits, a first driver/receiver circuit is configured to receive at least one first sensing signal, and apply a first gain to the first sensing signal to generate a first encoded signal; and a second driver/receiver circuit is configured to receive at least one second sensing signal other than the first sensing signal, and apply a second gain different from the first gain to the second sensing signal to generate a second encoded signal. The summation circuit is configured to sum up the first encoded signal and the second encoded signal to generate an encoded data.

20 Claims, 8 Drawing Sheets

SIGNAL PROCESSING CIRCUIT AND METHOD

BACKGROUND OF THE INVENTION

1. Field of the Invention

The present invention relates to a signal processing circuit and method, and more particularly, to a signal processing circuit and method for a sensor.

2. Description of the Prior Art

In recent years, touch sensing technology advances rapidly, and many consumer electronic products such as mobile phones, GPS navigator systems, tablets, personal digital assistants, laptops and vehicle control systems are equipped with touch sensing functions. In various electronic products, touch sensing functions are included in a display area which originally had only display functions. In other words, an original display panel is replaced by a touch panel having both display and touch sensing functions. The touch panels can generally be divided into out-cell and in-cell touch panels according to the difference in their structures. The out-cell touch panel is composed of an independent touch panel and a general display panel. In the in-cell touch panel, a touch sensing device including sensing pads or electrodes is directly disposed inside a substrate of the display panel.

Large noises usually occur on a touch panel to interfere with the touch sensing signals. Among the large noises, impulse noises are most likely to interfere with the touch sensing signals and degrade the touch sensing performance. In an out-cell touch panel, an encoder/decoder is usually applied to reduce or cancel the impulse noises, where driving signals with different phases are simultaneously applied to different sensing pads based on an encoding scheme. Specifically, the touch sensing signals may include a signal component and a noise component. Under the encoding scheme, the signal component may be encoded to another form by using an encoder and then restored by using a counterpart decoder, but the noise component may be scattered after being encoded and decoded. Such operations may reduce the magnitude of impulse noises, so as to reduce their impacts on the touch sensing operations.

In the in-cell touch panel, the touch sensor is highly integrated with the substrate of the display panel, resulting in tremendous capacitive loading on the touch sensor. The capacitive loading may generate a large burden on touch driving and sensing. In general, a load-free driving (LFD) operation may be performed on the in-cell touch panel, where an LFD signal having identical amplitude, frequency and phase is applied to other sensing pads when the touch sensing is performed on a certain sensing pad, in order to reduce the interferences of the capacitive loading. However, the touch sensing operations based on the above encoding scheme require driving signals having different phases, which conflicts with the requirement of LFD operation. Thus, there is a need for improvement over the prior art.

SUMMARY OF THE INVENTION

It is therefore an objective of the present invention to provide a novel signal processing circuit and method for handling the touch sensing operations by applying a load-free driving (LFD) signal along with a touch driving signal under an appropriate encoding scheme, in order to solve the abovementioned problems.

An embodiment of the present invention discloses a signal processing circuit, which comprises a driving signal generator and an encoder. The driving signal generator is configured to generate a driving signal. The encoder, coupled to the driving signal generator, comprises a multiplexer, a plurality of driver/receiver circuits and a summation circuit. The multiplexer is configured to receive a plurality of sensing signals through a plurality of sensing terminals in response to the driving signal. The plurality of driver/receiver circuits, coupled to the multiplexer, comprises a first driver/receiver circuit and a second driver/receiver circuit. The first driver/receiver circuit is configured to receive at least one first sensing signal among the plurality of sensing signals, and apply a first gain to the at least one first sensing signal to generate a first encoded signal. The second driver/receiver circuit is configured to receive at least one second sensing signal other than the at least one first sensing signal among the plurality of sensing signals, and apply a second gain to the at least one second sensing signal to generate a second encoded signal, wherein the second gain is different from the first gain. The summation circuit, coupled to the plurality of driver/receiver circuits, is configured to sum up the first encoded signal and the second encoded signal to generate an encoded data.

Another embodiment of the present invention discloses a signal processing method, which comprises steps of: outputting a driving signal through a plurality of sensing terminals; receiving a plurality of sensing signals through the plurality of sensing terminals in response to the driving signal; applying a first gain to at least one first sensing signal among the plurality of sensing signals to generate a first encoded signal; applying a second gain to at least one second sensing signal other than the at least one first sensing signal among the plurality of sensing signals to generate a second encoded signal, wherein the second gain is different from the first gain; and summing up the first encoded signal and the second encoded signal to generate an encoded data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
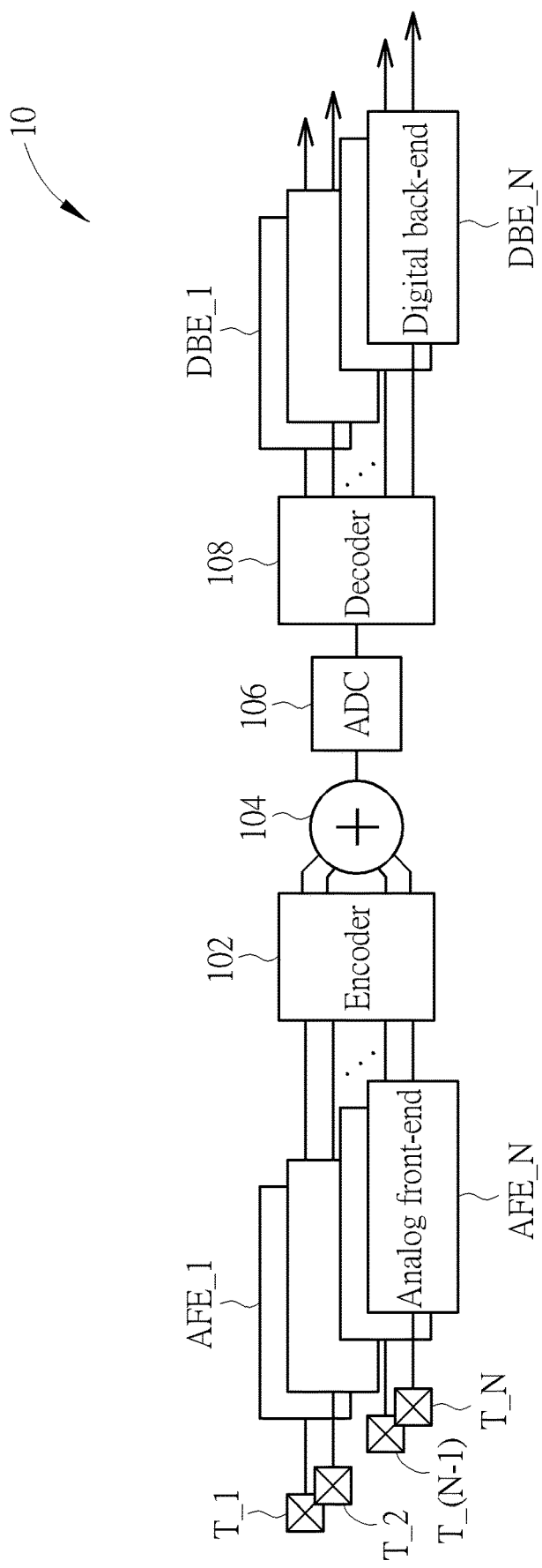
FIG. 1 is a schematic diagram of a signal processing circuit for processing touch sensing signals from a general out-cell touch panel.

FIG. 1 is a schematic diagram of a signal processing circuit for processing touch sensing signals from a general out-cell touch panel. The signal processing circuit 10 includes a plurality of analog front-end (AFE) circuits AFE_1-AFE_N, an encoder 102, an adder 104, an analog-to-digital converter (ADC) 106, a decoder 108 and a plurality of digital back-end (DBE) circuits DBE_1-DBE_N. The AFE circuits AFE_1-AFE_N are coupled to sensing terminals T_1-T_N, respectively, which may further be coupled to multiple sensing pads of a sensor such as a touch sensor, to receive sensing signals from the sensor. The encoder 102 may receive N sensing signals from the AFE circuits AFE_1-AFE_N, and encode the sensing signals with an encoding scheme. The sensing signals after being encoded are summed up by the adder 104. The ADC 106 then converts the summed sensing signals into digital data, and the decoder 108 decodes the digital data to restore N sensing data corresponding to the sensing signals received through the AFE circuits AFE_1-AFE_N. Subsequently, the DBE circuits DBE_1-DBE_N perform digital signal processing on the N sensing data and output the N sensing data, respectively.

As mentioned above, the encoding operation aims at reducing the interferences of impulse noises to improve the touch sensing performance. In order to implement the encoding operation, a sensing period for receiving the sensing signals may include N cycles, and thus the AFE circuits AFE_1-AFE_N may totally receive N*N sensing signals in the sensing period. The N sensing signals received in each cycle may be combined through the adder 104; hence, the N*N sensing signals are combined to generate N encoded signals. Correspondingly, the ADC 106 may output N digital data in the sensing period, and the decoder 108 may restore the N sensing data based on the N digital data received from the ADC 106.

Note that the circuit structure of the signal processing circuit 10 shown in FIG. 1 is merely an exemplary implementation for illustrating the encoding scheme. For example, in another embodiment, the DBE circuits DBE_1-DBE_N may be replaced by one or more DBE circuits deployed in front of the decoder or integrated with the decoder. Alternatively or additionally, the encoder 102 may be integrated with the AFE circuits AFE_1-AFE_N or deployed in front of the AFE circuits AFE_1-AFE_N, and the adder 104 may also be integrated with the AFE circuits AFE_1-AFE_N or implemented in any analog circuitry. In another embodiment, the encoder is implemented as a driver for outputting different driving signals based on the values of an encoding matrix, as described below.

Figure 2:
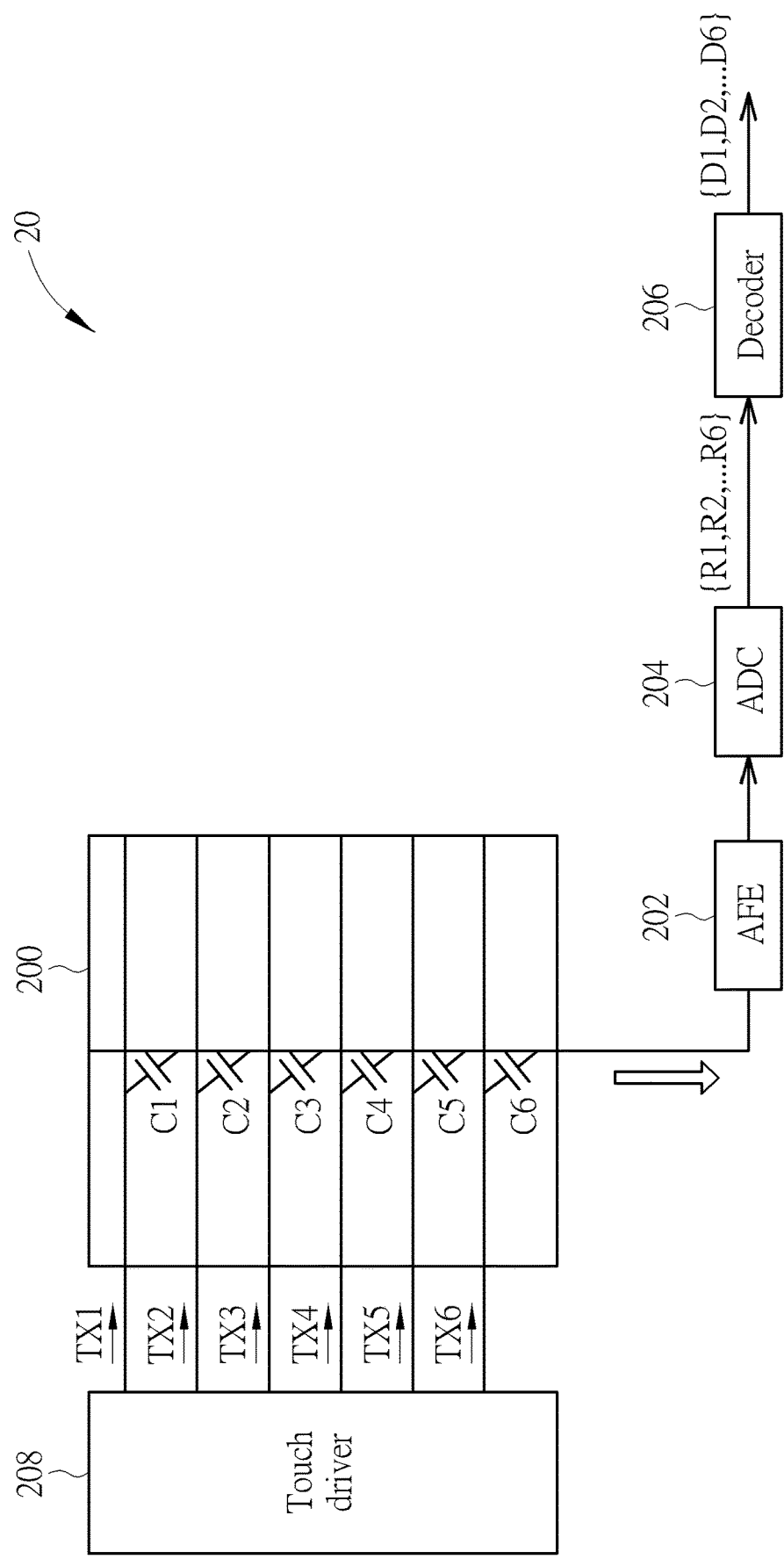
FIG. 2 illustrates an exemplary implementation of the encoding scheme applied in a signal processing circuit.

FIG. 2 illustrates an exemplary implementation of the encoding scheme applied in a signal processing circuit 20. The signal processing circuit 20, which is also used for an out-cell touch panel, includes an AFE circuit 202, an ADC 204, a decoder 206 and a touch driver 208. A DBE circuit, which may be deployed in front of or in back of the decoder 206, is omitted herein for brevity. The sensing terminals of the signal processing circuit 20 are coupled to a touch sensor 200, which may be a capacitive touch sensor. In this embodiment, the signal processing circuit 20 includes 6 sensing terminals (i.e., N is equal to 6), where the touch driver 208 outputs 6 touch driving signals TX1-TX6 to 6 sensing pads of the touch sensor 200, respectively. Each sensing pad is denoted by a capacitor, as shown in FIG. 2. In response to the touch driving signals TX1-TX6, capacitive touch sensing signals C1-C6 from the touch sensor 200 are received by the AFE circuit 202.

In this embodiment, the encoder may be implemented in the touch driver 208, where the encoding operation is performed by selectively outputting positive driving signals and negative driving signals as the touch driving signals TX1-TX6. For example, the encoding operation may be performed based on an encoding matrix M1 as described below:

$$M1 = \begin{bmatrix} 1 & 1 & 1 & 1 & 1 & -1 \\ -1 & 1 & 1 & 1 & 1 & 1 \\ 1 & -1 & 1 & 1 & 1 & 1 \\ 1 & 1 & -1 & 1 & 1 & 1 \\ 1 & 1 & 1 & -1 & 1 & 1 \\ 1 & 1 & 1 & 1 & -1 & 1 \end{bmatrix}; \quad (1)$$

where the values 1 and −1 in the encoding matrix M1 indicate a positive driving signal and a negative driving signal, respectively. Therefore, the encoded data R1-R6 may be calculated based on the touch sensing signals C1-C6 as follows:

$$\begin{bmatrix} R1 \\ R2 \\ R3 \\ R4 \\ R5 \\ R6 \end{bmatrix} = A0 \times M1 \begin{bmatrix} C1 \\ C2 \\ C3 \\ C4 \\ C5 \\ C6 \end{bmatrix} = A0 \begin{bmatrix} 1 & 1 & 1 & 1 & 1 & -1 \\ -1 & 1 & 1 & 1 & 1 & 1 \\ 1 & -1 & 1 & 1 & 1 & 1 \\ 1 & 1 & -1 & 1 & 1 & 1 \\ 1 & 1 & 1 & -1 & 1 & 1 \\ 1 & 1 & 1 & 1 & -1 & 1 \end{bmatrix} \begin{bmatrix} C1 \\ C2 \\ C3 \\ C4 \\ C5 \\ C6 \end{bmatrix}; \quad (2)$$

where C1-C6 are the touch sensing signals received from the touch sensor 200, R1-R6 are the encoded data generated after encoding, and A0 is a coefficient including the gain and/or conversion applied to the touch sensing signals C1-C6.

According to the encoding scheme as described in Equation (2), a sensing period has 6 cycles and 6 sensing signals are received in each cycle. In the $1^{st}$ cycle, the touch driving signals TX1-TX5 are positive signals and the touch driving signal TX6 is a negative signal, and the touch sensing signals C1-C6 received in the $1^{st}$ cycle are summed up in the AFE circuit 202 (which may include an adder as similar to the adder 104 shown in FIG. 1) to generate the encoded data R1. If the positive touch driving signals TX1-TX5 and the negative touch driving signal TX6 all have the same amplitude, the encoded data R1 may be equal to the summation of the touch sensing signals C1-C5 minus the touch sensing signal C6 to be multiplied by the coefficient A0. In the $2^{nd}$ cycle, the touch driving signals TX2-TX6 are positive signals and the touch driving signal TX1 is a negative signal, and the touch sensing signals C1-C6 received in the $2^{nd}$ cycle are summed up in the AFE circuit 202 to generate the encoded data R2. By the same token, the encoded data R3-R6 of the $3^{rd}$ to $6^{th}$ cycles may be obtained by applying 5 positive touch driving signals and 1 negative touch driving signal based on the encoding values. Note that the touch sensing signals C1-C6 may be the capacitive values or related analog signal values obtained from the touch sensor 200, while the encoded data R1-R6 may be digital data generated by the ADC 204. Therefore, the coefficient A0 may include the possible gain applied in the AFE circuit 202 and the DBE circuit, and the analog-to-digital conversion performed by the ADC 204.

In addition, the decoder 206 receives the encoded data R1-R6 and restores the sensing data D1-D6 corresponding to the touch sensing signals C1-C6 by applying a decoding matrix which is an inverse matrix of the encoding matrix; that is, the sensing data D1-D6 after decoded may be obtained as follows:

$$\begin{bmatrix} D1 \\ D2 \\ D3 \\ D4 \\ D5 \\ D6 \end{bmatrix} = A0 \begin{bmatrix} C1 \\ C2 \\ C3 \\ C4 \\ C5 \\ C6 \end{bmatrix} = M1^{-1} \begin{bmatrix} R1 \\ R2 \\ R3 \\ R4 \\ R5 \\ R6 \end{bmatrix}. \quad (3)$$

In this embodiment, the sensing data D1-D6 may be digital codes proportional to the analog touch sensing signals C1-C6. Therefore, the touch sensing information may be correctly carried in the sensing data D1-D6 to be output to the subsequent circuit or device.

Figure 3:
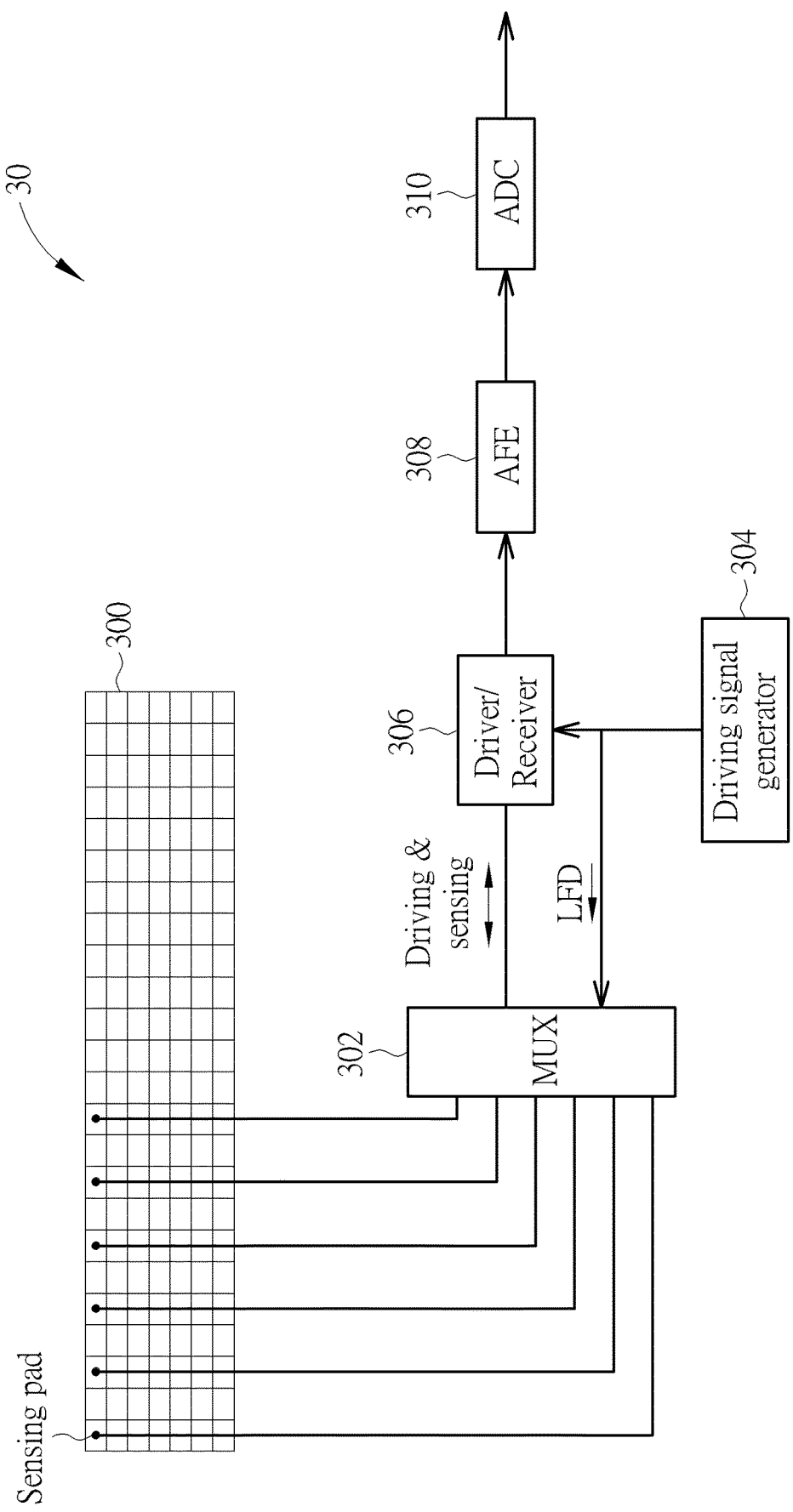
FIG. 3 is a schematic diagram of a signal processing circuit for processing touch sensing signals from a general in-cell touch panel.

FIG. 3 is a schematic diagram of a signal processing circuit for processing touch sensing signals from a general in-cell touch panel. The signal processing circuit 30 includes a multiplexer (MUX) 302, a driving signal generator 304, a driver/receiver circuit 306, an AFE circuit 308 and an ADC 310. The signal processing circuit 30 is coupled to a touch sensor 300 through multiple sensing terminals, where each sensing terminal may be coupled to a sensing pad of the touch sensor 300, as shown in FIG. 3.

In this implementation, only one sensing signal is received in a cycle of the sensing period. Since the MUX 302 is coupled to 6 sensing pads through 6 sensing terminals, the sensing period may have 6 cycles to complete the reception of 6 sensing signals, where the driver/receiver circuit 306 receives a sensing signal from one of the 6 sensing terminals in each cycle. When the touch driving signal is output to one sensing pad to receive the touch sensing signal from the sensing pad, the driving signal generator 304 may simultaneously output a load-free driving (LFD) signal to other sensing pads, as may be controlled by the MUX 302. The LFD signal is a signal of which the amplitude, frequency and/or phase are identical to the amplitude, frequency and/or phase of the touch driving signal. Preferably, the LFD signal is exactly the same as the touch driving signal, to completely cancel the interferences of capacitive loading on the touch panel.

In a general signal processing circuit for the in-cell touch panel such as the signal processing circuit 30, it is not feasible to apply an encoding scheme as in the signal processing circuit 10 or 20 for the out-cell touch panel. This is because the signal processing circuit 30 is requested to perform LFD operation for the in-cell touch panel. In the LFD operation, the signal processing circuit 30 may output the same signal to all the sensing pads of the touch sensor 300, where the currently sensed sensing pad receives the touch driving signal and other sensing pads receive the LFD signal, so as to avoid redundant burdens of touch sensing operations. In contrast, the above encoding scheme requires the coexistence of positive driving signal(s) and negative driving signal(s). In addition, in the signal processing circuit 30, each sensing terminal is coupled to one sensing pad and the sensing signals from different sensing pads are received sequentially, which is different from the signal processing circuit 20 where the AFE circuit 202 is coupled to multiple sensing pads for receiving the touch sensing signals C1-C6 simultaneously.

Figure 4:
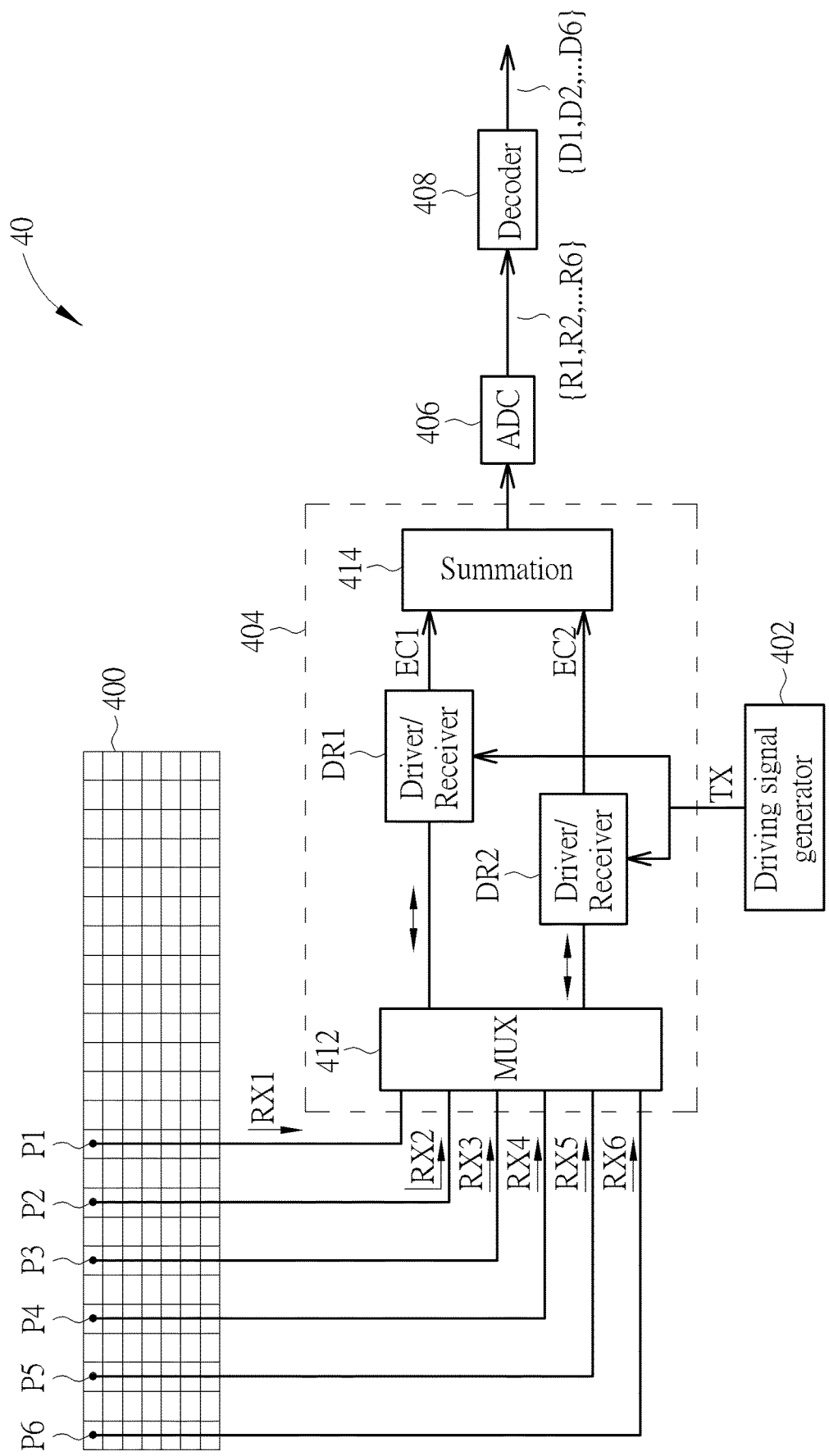
FIG. 4 is a schematic diagram of a signal processing circuit according to an embodiment of the present invention.

The present invention provides a novel signal processing circuit for an in-cell touch panel, where the LFD operation may be performed and the touch sensing signals may be processed with an appropriate encoding scheme. FIG. 4 is a schematic diagram of a signal processing circuit 40 according to an embodiment of the present invention. The signal processing circuit 40 includes a driving signal generator 402, an encoder 404, an ADC 406 and a decoder 408. The signal processing circuit 40 may be coupled to a touch sensor 400 through a plurality of sensing terminals. The driving signal generator 402 is configured to generate a touch driving signal TX. In some embodiments, the driving signal generator 402 may also generate an LFD signal of which the amplitude, frequency and/or phase are identical to those of the touch driving signal TX. The encoder 404 is coupled to the driving signal generator 402, and configured to output the touch driving signal TX (which is received from the driving signal generator 402) to the corresponding sensing pads of the touch sensor 400, and receive touch sensing signals RX1-RX6 in response to the touch driving signal TX.

More specifically, the encoder 404 includes a MUX 412, a plurality of driver/receiver circuits and a summation circuit 414. The MUX 412 is coupled to multiple sensing pads P1-P6 of the touch sensor 400 through a plurality of sensing terminals, respectively; hence, the touch sensing signals RX1-RX6 may be respectively received by the MUX 412 through the sensing terminals. In this embodiment, there are 2 driver/receiver circuits DR1 and DR2 included in the encoder 404. Among the touch sensing signals RX1-RX6 received from the touch sensor 400, at least one of the touch sensing signals RX1-RX6 may be delivered to the driver/receiver circuit DR1 and other touch sensing signal(s) may be delivered to the driver/receiver circuit DR2 through the control of the MUX 412. The driver/receiver circuit DR1 receiving at least one of the touch sensing signals RX1-RX6 may apply a gain A1 to the received touch sensing signal(s). The driver/receiver circuit DR1 thereby generates an encoded signal EC1 based on the received touch sensing signal(s). Simultaneously, the driver/receiver circuit DR2 receiving other touch sensing signal(s) may apply a gain A2 to the received touch sensing signal(s). The driver/receiver circuit DR2 thereby generates an encoded signal EC2 based on the received touch sensing signal(s).

In order to realize the encoding scheme, the gains A1 and A2 should have different values. Each of the touch sensing signals RX1-RX6 may be selectively received and processed by the driver/receiver circuit DR1 or DR2 according to an encoding matrix. For example, if the encoding matrix has 2 different values 1 and −1, the gain A1 applied in the driver/receiver circuit DR1 may be a positive gain as indicated by the value 1, and the gain A2 applied in the driver/receiver circuit DR2 may be a negative gain as indicated by the value −1. Note that the gains performed in the driver/receiver circuits DR1 and DR2 may be configured in any appropriate manner, not limited to the implementation described in this embodiment. For example, in another embodiment, the gain A1 may be a negative gain and the gain A2 may be a positive gain. Alternatively or additionally, the gains A1 and A2 may be both positive or both negative with different magnitudes. The summation circuit 414 of the encoder 404 is further used to sum up the encoded signals EC1 and EC2 to generate an encoded data, so as to realize the encoding scheme of the encoder 404.

Subsequently, the ADC 406 converts the analog encoded data into digital form, and the decoder 408 applies a decoding matrix on the encoded data to restore the original sensing data. The detailed operations of the ADC 406 and the decoder 408 are similar to those of the ADC 204 and the decoder 206 as shown in FIG. 2, and will not be repeated herein. Similarly, a DBE circuit may be deployed in the digital domain, and is omitted herein for brevity.

Figure 5:
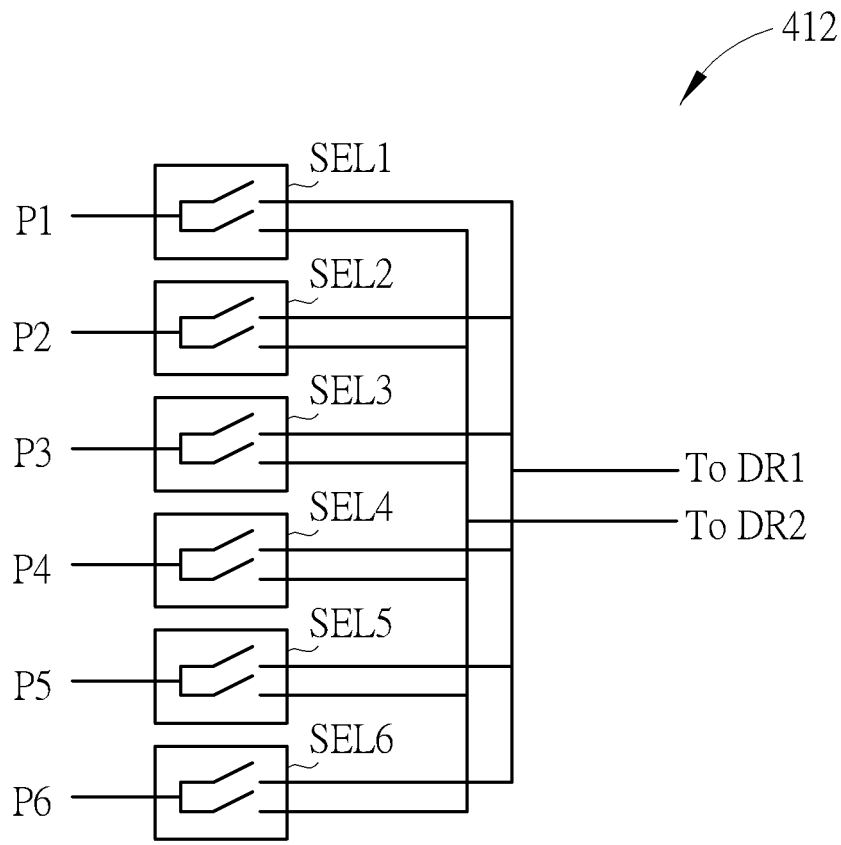
FIG. 5 illustrates a detailed implementation of the MUX.

FIG. 5 illustrates a detailed implementation of the MUX 412. The MUX 412 includes a plurality of select circuits. In this embodiment, the MUX 412 is coupled to the touch sensor 400 through 6 sensing terminals, and thus there are 6 select circuits SEL1-SEL6 included in the MUX 412, where each select circuit SEL1-SEL6 is coupled between one of the 6 sensing terminals and each of the driver/receiver circuits DR1 and DR2, to selectively couple the corresponding sensing terminal to one of the driver/receiver circuits DR1 and DR2. Correspondingly, each of the touch sensing signals RX1-RX6 may be delivered to one of the driver/receiver circuits DR1 and DR2.

The connections of the select circuits SEL1-SEL6 may be configured according to an encoding matrix of the encoder 404. For example, if the encoding matrix M1 provided in Equation (1) is applied, a sensing period may include 6 cycles, and 6 touch sensing signals RX1-RX6 are received in each cycle. More specifically, in the $1^{st}$ cycle, the select circuits SEL1-SEL6 are configured to forward the touch sensing signals RX1-RX5 to the driver/receiver circuit DR1 and forward the touch sensing signal RX6 to the driver/receiver circuit DR2. In the $2^{nd}$ cycle, the select circuits SEL1-SEL6 are configured to forward the touch sensing signals RX2-RX6 to the driver/receiver circuit DR1 and forward the touch sensing signal RX1 to the driver/receiver circuit DR2. In short, a sensing signal will be forwarded to the driver/receiver circuit DR1 if the corresponding value in the encoding matrix is "1", and a sensing signal will be forwarded to the driver/receiver circuit DR2 if the corresponding value in the encoding matrix is "−1".

In an embodiment, each of the select circuits SEL1-SEL6 may be easily implemented by using two switches to be coupled to the driver/receiver circuits DR1 and DR2, respectively. The detailed implementations are well known by a skilled person and will not be narrated herein.

Different from the signal processing circuit 30 shown in FIG. 3 where the MUX 302 receives only one sensing signal in each cycle, in the signal processing circuit 40 shown in FIG. 4, the MUX 412 may simultaneously receive the touch sensing signals RX1-RX6 from the touch sensor 400 in each cycle. This may be achieved by outputting the touch driving signal TX to multiple sensing pads of the touch sensor 400 simultaneously. In this embodiment, the MUX 412 may be coupled to 6 sensing pads P1-P6 through the 6 sensing terminals, respectively, as shown in FIG. 4 and FIG. 5. Therefore, the touch driving signal TX may be simultaneously output to the sensing pads P1-P6, and thus the MUX 412 may simultaneously receive the sensing signals RX1-RX6 from the sensing pads P1-P6, respectively.

Please continue to refer to FIG. 4. Supposing that the encoding matrix M1 provided in Equation (1) is applied, in the $1^{st}$ cycle, the touch sensing signals RX1-RX5 are delivered to the driver/receiver circuit DR1, which may combine the touch sensing signals RX1-RX5 and apply the gain A1 (e.g., a positive gain corresponding to the encoding value 1) to generate the encoded signal EC1. Simultaneously, the touch sensing signal RX6 is delivered to the driver/receiver circuit DR2, which may apply the gain A2 (e.g., a negative gain corresponding to the encoding value −1) to the touch sensing signal RX6 to generate the encoded signal EC2. The summation circuit 414 then sums up the encoded signals EC1 and EC2 to generate an encoded data of the $1^{st}$ cycle, and the encoded data may be converted into digital form (by the ADC 406), as the encoded data R1 shown in FIG. 4.

Similarly, in the $2^{nd}$ cycle, the touch sensing signal RX1 is delivered to the driver/receiver circuit DR1, which may apply the gain A1 to the touch sensing signal RX1 to generate the encoded signal EC1. Simultaneously, the touch sensing signals RX2-RX6 are delivered to the driver/receiver circuit DR2, which may sum up the touch sensing signals RX2-RX6 and apply the gain A2 to generate the encoded signal EC2. The summation circuit 414 then sums up the encoded signals EC1 and EC2 to generate an encoded data of the $2^{nd}$ cycle, and the encoded data may be converted into digital form as the encoded data R2. By the same token, the encoded data R3-R6 for the $3^{rd}$ to $6^{th}$ cycles of the sensing period may be generated based on the encoding matrix M1.

Note that each of the encoded data R1-R6 is a mixture of the touch sensing signals RX1-RX6. Therefore, the decoder 408 may decode the encoded data R1-R6 to restore the sensing data D1-D6, as the calculation specified in the above Equation (3). That is, the decoder 408 may be configured with a decoding matrix used for performing decoding, where the decoding matrix is an inverse matrix of the encoding matrix M1 applied in the encoder 404.

Figure 6:
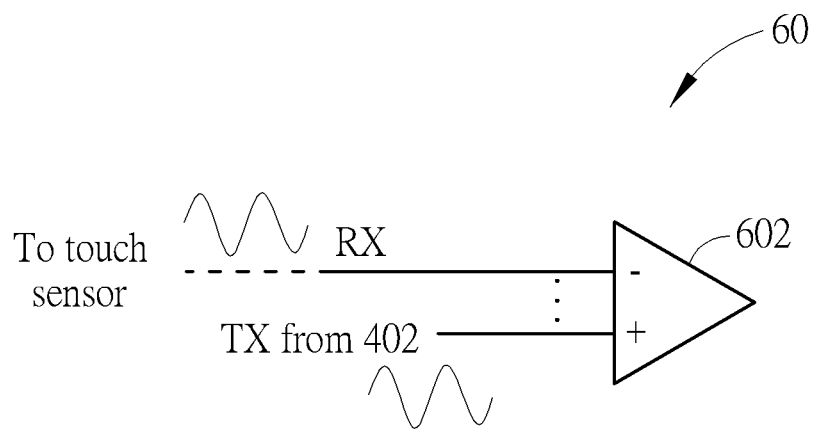
FIG. 6 illustrates an exemplary implementation of a driver/receiver circuit according to an embodiment of the present invention.

FIG. 6 illustrates an exemplary implementation of a driver/receiver circuit 60 according to an embodiment of the present invention, which may be any of the driver/receiver circuits DR1 and DR2. The driver/receiver circuit 60 includes an operational amplifier (op-amp) 602. The positive input terminal of the op-amp 602 may be coupled to the driving signal generator 402, and the negative input terminal of the op-amp 602 may be coupled to the touch sensor 400 (i.e., through the MUX 412). The driving signal generator 402 applies the touch driving signal TX to the positive input terminal of the op-amp 602. Due to the virtual short-circuit between the differential input terminals of the op-amp 602, the touch driving signal TX applied to the positive input terminal may be coupled to the negative input terminal, to be output to the sensing pads of the touch sensor 400. Correspondingly, the touch sensing signals RX, which may include any of the touch sensing signals RX1-RX6, may be received by the op-amp 602 through the negative input terminal. The op-amp 602 may further apply a gain to amplify the received touch sensing signals RX, and output the amplified touch sensing signals RX to the subsequent circuitry.

Please note that there may be at least one circuit block deployed between the driver/receiver circuits DR1 and DR2 and the ADC 406, for processing the touch sensing signals in the analog domain. For example, a filter may be deployed to filter out unnecessary noises in other frequencies, and/or a current-to-voltage converter may be deployed to convert the current signals output by the driver/receiver circuits DR1 and DR2 into voltage signals receivable by the ADC 406. The filter and/or the current-to-voltage converter may be easily designed to contain the summation circuit 414, so as to realize the summation of the encoded signals EC1 and EC2. For example, the filter and/or the current-to-voltage converter may be modified to have multiple input terminals for receiving the encoded signals, respectively. Alternatively, the summation circuit 414 may be a stand-alone analog adder deployed in front of the ADC 406.

Please also note that the present invention aims at providing a signal processing circuit capable of performing the LFD operation while applying an appropriate encoding scheme for an in-cell touch panel. Those skilled in the art may make modifications and alterations accordingly. For example, in the signal processing circuit 40 shown in FIG. 4, there may be a DBE circuit deployed in front of or in back of the decoder 408, for performing necessary digital signal processing on the encoded or decoded data. Similarly, an AFE circuit may be deployed in front of the ADC 406, to be integrated with the encoder 404 or deployed between the encoder 404 and the ADC 406, for performing necessary analog signal processing on the touch sensing signals. In addition, in the above embodiments, the signal processing circuit is used for driving a touch sensor or touch panel, where the output driving signal is a touch driving signal and the received sensing signals are touch sensing signals. In another embodiment, the signal processing circuit may be applicable to another type of sensor such as an optical image sensor or fingerprint sensor, to reduce or cancel the noise interferences on the sensing signals by applying an encoding scheme.

Further, the implementation of the driver/receiver circuits shown in FIG. 4 is merely one of various embodiments of the present invention. In another embodiment, the encoder may include more than 2 driver/receiver circuits to be adapted to the encoding matrix. In general, when the encoding matrix of the encoder has N different values other than 0, the encoder may include N driver/receiver circuits, where each driver/receiver circuit may apply a specific gain to the received sensing signals, to be corresponding to the value of the encoding matrix.

Figure 7:
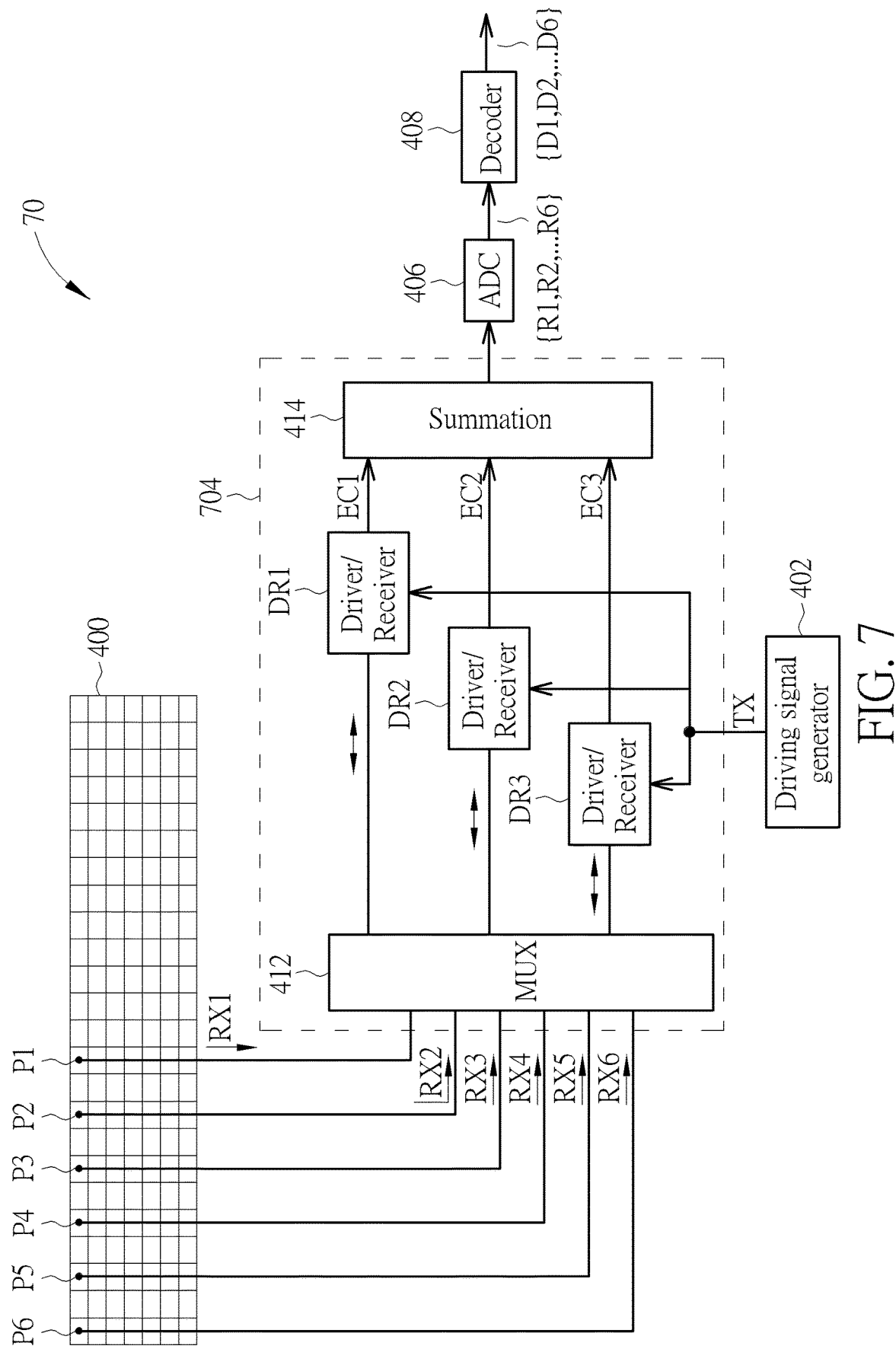
FIG. 7 is a schematic diagram of a signal processing circuit according to an embodiment of the present invention.

FIG. 7 is a schematic diagram of a signal processing circuit 70 according to an embodiment of the present invention. The structure of the signal processing circuit 70 is similar to the structure of the signal processing circuit 40 as shown in FIG. 4, so signals having similar functions are denoted by the same symbols. As shown in FIG. 7, the difference between the signal processing circuit 70 and the signal processing circuit 40 is that the encoder 704 of the signal processing circuit 70 includes 3 driver/receiver circuits DR1-DR3. In this embodiment, another encoding matrix M2 may be applied to encode the received sensing signals RX1-RX6, as shown below:

$$M2 = \begin{bmatrix} 1 & 1 & 0.5 & -1 & 1 & -1 \\ -1 & 1 & 1 & 0.5 & -1 & 1 \\ 1 & -1 & 1 & 1 & 0.5 & -1 \\ -1 & 1 & -1 & 1 & 1 & 0.5 \\ 0.5 & -1 & 1 & -1 & 1 & 1 \\ 1 & 0.5 & -1 & 1 & -1 & 1 \end{bmatrix}.$$

In the encoding matrix M2, the values 1, −1 and 0.5 may indicate three different gains A1-A3, which are provided by the driver/receiver circuits DR1-DR3, respectively. More specifically, the driver/receiver circuit DR1 applies the gain A1 which may be a positive gain with a unit of amplitude, the driver/receiver circuit DR2 applies the gain A2 which may be a negative gain with a unit of amplitude, and the driver/receiver circuit DR3 applies the gain A3 which may be a positive gain with a smaller amplitude equal to one-half of the amplitude of the gain A1 or any other appropriate amplitude value.

According to the encoding matrix M2, a sensing period may include 6 cycles, and 6 touch sensing signals RX1-RX6 are received in each cycle. More specifically, in the $1^{st}$ cycle, the touch sensing signals RX1, RX2 and RX5, corresponding to the encoding value 1, are delivered to the driver/receiver circuit DR1, which may combine these touch sensing signals and apply the gain A1 to generate the encoded signal EC1. Simultaneously, the touch sensing signals RX4 and RX6, corresponding to the encoding value −1, are delivered to the driver/receiver circuit DR2, which may combine these touch sensing signals and apply the gain A2 to generate the encoded signal EC2. Simultaneously, the touch sensing signal RX3, corresponding to the encoding value 0.5, is delivered to the driver/receiver circuit DR3, which may apply the gain A3 to the touch sensing signal RX3 to generate the encoded signal EC3. The summation circuit 414 then sums up the encoded signals EC1-EC3 to generate an encoded data of the $1^{st}$ cycle, and the encoded data may be converted into digital form (by the ADC 406), as the encoded data R1 shown in FIG. 7. By the same token, the encoded data R2-R6 for the $2^{nd}$ to $6^{th}$ cycles of the sensing period may be generated based on the encoding matrix M2. The decoder 408 then decodes the encoded data R1-R6 to restore the sensing data D1-D6 based on the decoding matrix $M2^{-1}$.

Figure 8:
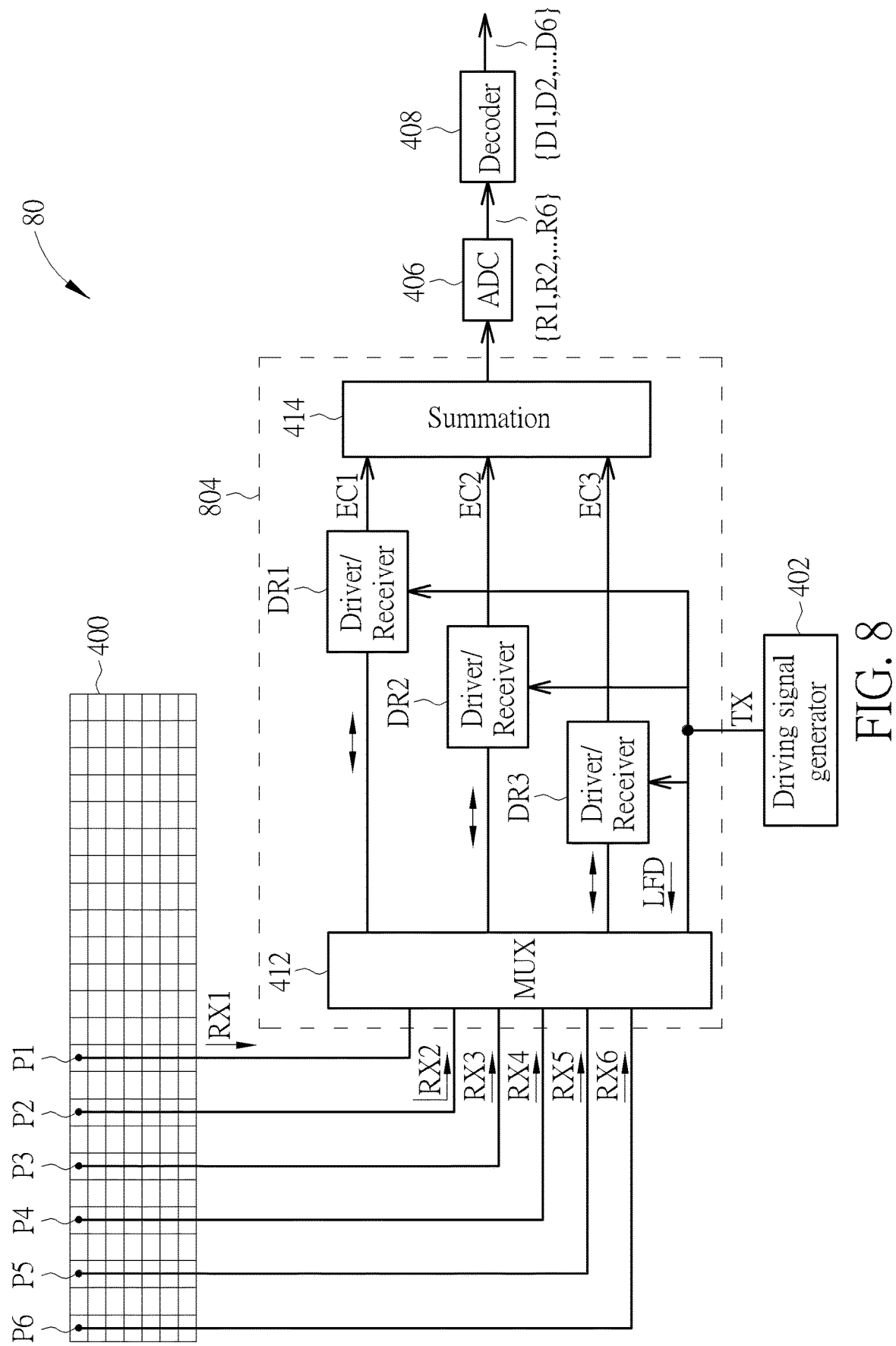
FIG. 8 is a schematic diagram of another signal processing circuit according to an embodiment of the present invention.

FIG. 8 is a schematic diagram of another signal processing circuit 80 according to an embodiment of the present invention. The structure of the signal processing circuit 80 is similar to the structure of the signal processing circuit 70 as shown in FIG. 7, so signals having similar functions are denoted by the same symbols. As shown in FIG. 8, the difference between the signal processing circuit 80 and the signal processing circuit 70 is that, in the encoder 804 of the signal processing circuit 80, the touch driving signal TX is served as an LFD signal to be output to the touch sensor (through the MUX 412) without being driven and processed by any of the driver/receiver circuit DR1-DR3. In this embodiment, a further encoding matrix M3 may be applied to encode the received sensing signals RX1-RX6, as shown below:

$$M3 = \begin{bmatrix} 1 & 1 & 0.5 & -1 & 0 & -1 \\ -1 & 1 & 1 & 0.5 & -1 & 0 \\ 0 & -1 & 1 & 1 & 0.5 & -1 \\ -1 & 0 & -1 & 1 & 1 & 0.5 \\ 0.5 & -1 & 0 & -1 & 1 & 1 \\ 1 & 0.5 & -1 & 0 & -1 & 1 \end{bmatrix}.$$

In the encoding matrix M3, the values 1, −1 and 0.5 may indicate three different gains A1-A3, which are provided by the driver/receiver circuits DR1-DR3, respectively. The encoding matrix M3 further includes the value 0, which means that the corresponding touch sensing signal is not received and contained in the encoded data; hence, the corresponding sensing signal may be omitted by the signal processing circuit 80. As shown in FIG. 8, in addition to the driver/receiver circuits DR1-DR3, the encoder 804 further includes an additional output terminal for delivering the LFD signal, but no touch sensing signal is received in this terminal, so as to satisfy the encoding value 0.

According to the encoding matrix M3, a sensing period may include 6 cycles, and 6 touch sensing signals RX1-RX6 are received in each cycle. More specifically, in the $1^{st}$ cycle, the touch sensing signals RX1 and RX2, corresponding to the encoding value 1, are delivered to the driver/receiver circuit DR1, which may combine these touch sensing signals and apply the gain A1 to generate the encoded signal EC1. Simultaneously, the touch sensing signals RX4 and RX6, corresponding to the encoding value −1, are delivered to the driver/receiver circuit DR2, which may combine these touch sensing signals and apply the gain A2 to generate the encoded signal EC2. Simultaneously, the touch sensing signal RX3, corresponding to the encoding value 0.5, is delivered to the driver/receiver circuit DR3, which may apply the gain A3 to the touch sensing signal RX3 to generate the encoded signal EC3. Simultaneously, the sensing pad for generating the touch sensing signal RX5, corresponding to the encoding value 0, is applied with the LFD signal without outputting the touch sensing signal RX5. The summation circuit 414 then sums up the encoded signals EC1-EC3 to generate an encoded data of the $1^{st}$ cycle, and the encoded data may be converted into digital form (by the ADC 406), as the encoded data R1 shown in FIG. 8. By the same token, the encoded data R2-R6 for the $2^{nd}$ to $6^{th}$ cycles of the sensing period may be generated based on the encoding matrix M3. The decoder 408 then decodes the encoded data R1-R6 to restore the sensing data D1-D6 based on the decoding matrix $M3^{-1}$.

In a sensor integrated circuit (IC) for a touch sensor or touch panel, there may be a plurality of channels, where each channel includes a signal processing circuit, such as any of the signal processing circuit 40, 70 or 80 described above, for controlling several sensing pads (e.g., 6 sensing pads as in the above embodiments) of the touch sensor/panel. Therefore, the same touch driving signal may be applied to these sensing pads simultaneously. Meanwhile, other sensing pads on the touch sensor/panel may receive the same touch driving signal and return the touch sensing signals to a signal processing circuit of another channel, or receive the LFD signal for reducing the influences of capacitive loading. In addition, the touch sensing signals of the corresponding sensing pads may be simultaneously received by the signal processing circuit, where the encoder applies an encoding scheme to process the received touch sensing signals. The encoder may include at least 2 driver/receiver circuits configured to apply different gains based on the encoding matrix. As a result, the touch driving signal or the LFD signal having the same amplitude, frequency and/or phase may be output to every sensing pad of the touch sensor/panel, and the encoding operation may be performed by applying different gains in the driver/receiver circuits, so as to make the encoding scheme feasible to an in-cell touch panel.

Figure 9:
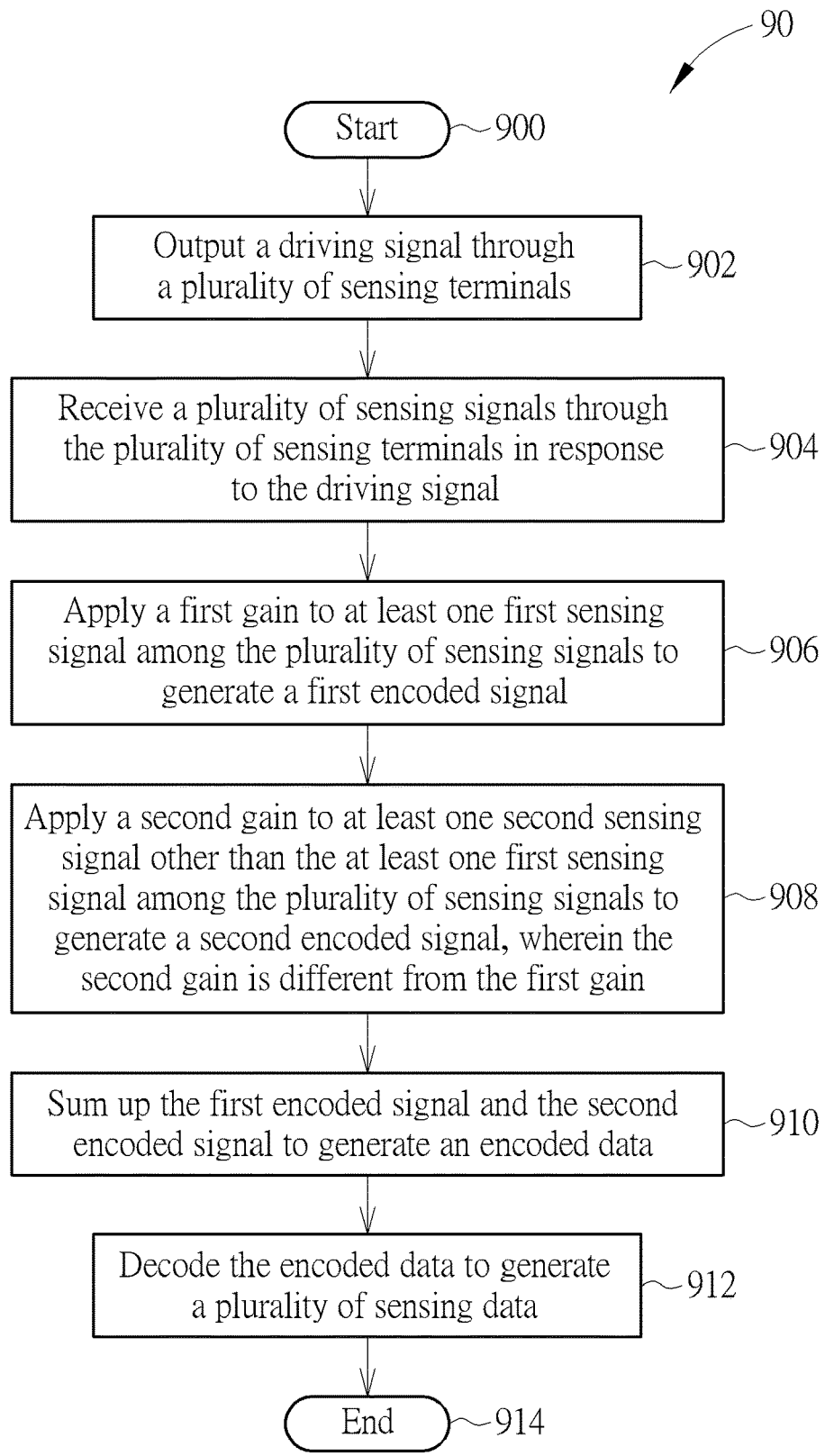
FIG. 9 is a flowchart of a signal processing process according to an embodiment of the present invention.

The abovementioned operations of processing the touch sensing signals may be summarized into a signal processing process 90, as shown in FIG. 9. The signal processing process 90, which may be implemented in a signal processing circuit such as the signal processing circuit 40, 70 or 80, includes the following steps:

Step 900: Start.

Step 902: Output a driving signal through a plurality of sensing terminals.

Step 904: Receive a plurality of sensing signals through the plurality of sensing terminals in response to the driving signal.

Step 906: Apply a first gain to at least one first sensing signal among the plurality of sensing signals to generate a first encoded signal.

Step 908: Apply a second gain to at least one second sensing signal other than the at least one first sensing signal among the plurality of sensing signals to generate a second encoded signal, wherein the second gain is different from the first gain.

Step 910: Sum up the first encoded signal and the second encoded signal to generate an encoded data.

Step 912: Decode the encoded data to generate a plurality of sensing data.

Step 914: End.

The detailed implementations and alterations of the signal processing process 90 are described in the above paragraphs, and will not be narrated herein.

To sum up, the present invention provides a signal processing circuit capable of performing the LFD operation while applying an appropriate encoding scheme for an in-cell touch panel. In the signal processing circuit of the present invention, the encoder includes at least 2 driver/receiver circuits, which output the same touch driving signal to the touch panel and apply different gains to the received touch sensing signals to realize the encoding operation. Based on an encoding matrix, the sensing period includes multiple cycles. In each cycle, a plurality of touch sensing signals are simultaneously received and each is delivered to one of the driver/receiver circuits selectively. The encoded signals generated by the driver/receiver circuits are then summed up to generate an encoded data. Subsequently, the decoder receives the encoded data in all the cycles of the sensing period, and decodes the encoded data based on a decoding matrix which is an inverse matrix of the encoding matrix, so as to restore the sensing data. The above encoding operation may reduce or cancel the impulse noises in the touch sensing signals. According to the present invention, the same touch driving signal and LFD signal may be output to the sensing pads to realize the LFD operation, and the encoding operation may be performed by applying different gains in the driver/receiver circuits, so as to make the encoding scheme feasible to an in-cell touch panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, comprising:
a driving signal generator, configured to generate a driving signal;
an encoder, coupled to the driving signal generator, comprising:
a multiplexer, configured to receive a plurality of sensing signals through a plurality of sensing terminals in response to the driving signal;
a plurality of driver/receiver circuits, coupled to the multiplexer, comprising:
a first driver/receiver circuit, configured to output the driving signal, receive at least one first sensing signal among the plurality of sensing signals, and apply a first gain to the at least one first sensing signal to generate a first encoded signal; and
a second driver/receiver circuit, configured to output the driving signal, receive at least one second sensing signal other than the at least one first sensing signal among the plurality of sensing signals, and apply a second gain to the at least one second sensing signal to generate a second encoded signal, wherein the second gain is different from the first gain; and
a summation circuit, coupled to the plurality of driver/receiver circuits, configured to sum up the first encoded signal and the second encoded signal to generate an encoded data.

2. The signal processing circuit of claim 1, wherein each of the first driver/receiver circuit and the second driver/receiver circuit comprises:
an operational amplifier, comprising:
a first input terminal, coupled to the driving signal generator and applied with the driving signal; and
a second input terminal, coupled to the multiplexer, configured to receive the at least one first sensing signal or the at least one second sensing signal by outputting the driving signal.

3. The signal processing circuit of claim 1, wherein the multiplexer comprises a plurality of select circuits, each coupled between a sensing terminal among the plurality of sensing terminals and each of the plurality of driver/receiver circuits, configured to selectively couple the corresponding sensing terminal to one of the plurality of driver/receiver circuits.

4. The signal processing circuit of claim 3, wherein each of the plurality of select circuits couples the corresponding sensing terminal to one of the plurality of driver/receiver circuits in each cycle of a sensing period according to an encoding matrix.

5. The signal processing circuit of claim 4, further comprising:
a decoder, configured to decode the encoded data to generate a plurality of sensing data, wherein the decoder is configured with a decoding matrix which is an inverse matrix of the encoding matrix.

6. The signal processing circuit of claim 1, wherein the summation circuit is contained in a filter or a current-to-voltage converter, or comprises a stand-alone adder.

7. The signal processing circuit of claim 1, wherein the multiplexer is coupled to a plurality of sensing pads of a sensor through the plurality of sensing terminals, respectively, and the driving signal is simultaneously output to the plurality of sensing pads.

8. The signal processing circuit of claim 1, wherein the multiplexer is coupled to a plurality of sensing pads of a sensor through the plurality of sensing terminals, respectively, and configured to simultaneously receive the plurality of sensing signals from the plurality of sensing pads, respectively.

9. The signal processing circuit of claim 1, wherein one of the first gain and the second gain is a positive gain and the other of the first gain and the second gain is a negative gain.

10. The signal processing circuit of claim 1, wherein the plurality of driver/receiver circuits comprises N driver/receiver circuits when an encoding matrix of the encoder has N different values other than 0.

11. The signal processing circuit of claim 10, wherein the encoder is configured to omit a third sensing signal when a value of the encoding matrix corresponding to the third sensing signal indicates that the third sensing signal is not contained in the encoded data.

12. The signal processing circuit of claim 1, wherein the plurality of sensing signals are a plurality of touch sensing signals, and the driving signal is a touch driving signal.

13. A signal processing method, comprising:
outputting a driving signal through a plurality of sensing terminals;
receiving a plurality of sensing signals through the plurality of sensing terminals in response to the driving signal;
applying a first gain to at least one first sensing signal among the plurality of sensing signals to generate a first encoded signal;
applying a second gain to at least one second sensing signal other than the at least one first sensing signal among the plurality of sensing signals to generate a second encoded signal, wherein the second gain is different from the first gain; and
summing up the first encoded signal and the second encoded signal to generate an encoded data.

14. The signal processing method of claim 13, wherein each of the plurality of sensing signals is applied with the first gain or the second gain in each cycle of a sensing period according to an encoding matrix.

15. The signal processing method of claim 14, further comprising:
decoding the encoded data to generate a plurality of sensing data by using a decoding matrix which is an inverse matrix of the encoding matrix.

16. The signal processing method of claim 13, wherein the driving signal is simultaneously output to a plurality of sensing pads of a sensor through the plurality of sensing terminals, respectively.

17. The signal processing method of claim 13, wherein the plurality of sensing signals are simultaneously received from a plurality of sensing pads of a sensor through the plurality of sensing terminals, respectively.

18. The signal processing method of claim 13, wherein one of the first gain and the second gain is a positive gain and the other one of the first gain and the second gain is a negative gain.

19. The signal processing method of claim 13, further comprising:
omitting a third sensing signal when a value of an encoding matrix corresponding to the third sensing signal indicates that the third sensing signal is not contained in the encoded data.

20. The signal processing method of claim 13, wherein the plurality of sensing signals are a plurality of touch sensing signals, and the driving signal is a touch driving signal.

* * * * *